(12) United States Patent
Deshpande et al.

(10) Patent No.: US 8,482,329 B2
(45) Date of Patent: Jul. 9, 2013

(54) HIGH VOLTAGE INPUT RECEIVER WITH HYSTERESIS USING LOW VOLTAGE TRANSISTORS

(75) Inventors: Vani Deshpande, Karnataka (IN); Anuroop Iyengar, Karnataka (IN); Pramod Elamannu Parameswaran, Karnataka (IN); Pankaj Kumar, Karnataka (IN)

(73) Assignee: LSI Corporation, San Jose, CA (US)

( * ) Notice: Subject to any disclaimer, the term of this patent is extended or adjusted under 35 U.S.C. 154(b) by 131 days.

(21) Appl. No.: 12/188,227

(22) Filed: Aug. 8, 2008

(65) Prior Publication Data
US 2010/0033214 A1 Feb. 11, 2010

(51) Int. Cl.
*H03K 3/00* (2006.01)
(52) U.S. Cl.
USPC .......................................... 327/205
(58) Field of Classification Search
USPC ........................................... 327/205
See application file for complete search history.

(56) References Cited

U.S. PATENT DOCUMENTS

| | | | | |
|---|---|---|---|---|
| 5,821,786 A * | 10/1998 | Nozuyama et al. | ........... | 327/141 |
| 5,942,940 A * | 8/1999 | Dreps et al. | .................... | 330/253 |
| 6,498,751 B2 * | 12/2002 | Ordonez et al. | ......... | 365/185.21 |
| 6,885,221 B2 * | 4/2005 | Watanabe et al. | ............... | 327/23 |
| 6,914,466 B2 * | 7/2005 | Ajit | ................ | 327/205 |
| 7,034,514 B2 * | 4/2006 | Tachibana et al. | ............ | 323/313 |
| 2002/0175716 A1 * | 11/2002 | Cyrusian | ...................... | 327/108 |
| 2003/0001632 A1 * | 1/2003 | Anderson et al. | ............. | 327/112 |
| 2006/0171188 A1 * | 8/2006 | Kawasumi | .................... | 365/154 |
| 2006/0290635 A1 * | 12/2006 | Fratti et al. | ...................... | 345/98 |
| 2007/0040587 A1 * | 2/2007 | Chatal | ............................ | 327/65 |

* cited by examiner

*Primary Examiner* — Daniel Rojas
(74) *Attorney, Agent, or Firm* — Mendelsohn, Drucker & Associates, P.C.; Steve Mendelsohn

(57) ABSTRACT

A high voltage input receiver with hysteresis using low voltage transistors is disclosed. In one embodiment, an input receiver circuit includes a hysteresis comparator circuit, based on a plurality of low voltage transistors, for generating a first output voltage by comparing an external voltage and a reference voltage and a stress protection circuit for preventing the plurality of low voltage transistors of the hysteresis comparator circuit from exceeding their reliability limits. In addition, the reference voltage is used to set a positive trip point and a negative trip point. Moreover, the input receiver circuit includes a source follower circuit for transferring the first output voltage to an output node of the source follower circuit from a voltage level of a VDDIO to a voltage level of a VDD.

18 Claims, 4 Drawing Sheets

HIGH VOLTAGE INPUT RECEIVER WITH HYSTERESIS USING LOW VOLTAGE TRANSISTORS

FIELD OF TECHNOLOGY

Embodiments of the present invention relate to the field of electronics. More particularly, embodiments of the present invention relate to an input receiver.

BACKGROUND

An input receiver (e.g., a low voltage complementary metal oxide semiconductor (LVCMOS) receiver) downconverts an external signal (e.g., a pad signal) at an input/output (I/O) supply voltage level to feed the downconverted signal to the core of a semiconductor chip at a required voltage level. Currently, the input receiver employs an inverter or buffer like architecture which fixes its dc trip point based on the size of the input receiver. Thus, if the external signal of the input receiver is greater than the dc trip point, then it is converted to the supply voltage level of the input receiver, whereas if the external signal is less than the dc trip point, then it is converted to zero voltage.

The input receiver may be built with a hysteresis to compensate for noise in the external signal. Thus, when the output of the hysteresis input receiver is in a low state (e.g., 0 volt), the output of the hysteresis input receiver transitions from the low state to a high state only if the external voltage is greater than a positive DC trip point, which is the reference voltage increased by a positive (low state-to-high state transitioning) threshold voltage. Likewise, when the output of the hysteresis input receiver is in the high state, the output of the hysteresis input receiver transitions from the high state to the low state only if the external voltage is less than a negative DC trip point, which is the reference voltage decreased by a negative (high state-to-low state transitioning) threshold voltage.

The arrangement for the hysteresis input receiver may work well when the I/O supply voltage level (e.g., 1.8 volts) is equal or less than the maximum voltage (e.g., 1.8 volts) that low voltage transistors in the hysteresis input receiver can sustain. However, for higher I/O supply voltage levels (e.g., 2.5 volts or 3.3 volts) greater than the maximum voltage (e.g., 1.8 volts) that the low voltage transistors can sustain, the design may stress the low voltage transistors, thereby degrading performance of the hysteresis input receiver. For example, the design of the hysteresis input receiver may have to be heavily skewed to meet the LVCMOS joint electron device engineering council (JEDEC) switching thresholds for higher supply voltages (e.g., 3.3 volts), and the distortion in the design of the hysteresis input receiver may degrade the receiver's performance.

SUMMARY

A high voltage input receiver with hysteresis using low voltage transistors is disclosed. In one aspect, an input receiver system includes a hysteresis comparator coupled to an input/output supply voltage (VDDIO) for generating a first output voltage by comparing an external voltage and a reference voltage. The hysteresis comparator is formed using a plurality of low voltage transistors. The input receiver system further includes a source follower coupled to a core supply voltage (VDD) for transferring the first output voltage to an output node of the source follower from a voltage level of the VDDIO to a voltage level of the VDD and a stress protection module coupled to the hysteresis comparator for preventing the plurality of low voltage transistors of the hysteresis comparator from exceeding their reliability limits. The reference voltage is used to set a positive trip point and a negative trip point.

In another aspect, an input receiver circuit includes a hysteresis comparator circuit based on a plurality of low voltage transistors coupled to an input/output supply voltage (VDDIO) for generating a first output voltage by comparing an external voltage and a reference voltage. The hysteresis comparator circuit includes a differential amplifier with the external voltage coupled to a first leg of the differential amplifier and the reference voltage coupled to a second leg of the differential amplifier, and a tail current source coupled to the differential amplifier.

The hysteresis comparator circuit also includes a first load coupled to the first leg of the differential amplifier, a second load coupled to the second leg of the differential amplifier, a first coupling module coupled to the second leg for forming a first current mirror with the first load, and a second coupling module coupled to the first leg for forming a second current mirror with the second load. The tail current source is coupled to a ground and the first load, the first coupling module, the second coupling module, and the second load are coupled to the stress protection module.

The input receiver circuit further includes a source follower circuit coupled to a core supply voltage (VDD) for transferring the first output voltage to an output node of the source follower circuit from a voltage level of the VDDIO to a voltage level of the VDD, and a stress protection circuit coupled to the hysteresis comparator circuit for preventing the plurality of low voltage transistors of the hysteresis comparator circuit from exceeding their reliability limits.

The systems and apparatuses disclosed herein may be implemented in any means for achieving various aspects. Other features will be apparent from the accompanying drawings and from the detailed description that follows.

BRIEF DESCRIPTION OF THE DRAWINGS

Embodiments of the present invention are illustrated by way of an example and not limited to the figures of the accompanying drawings, in which like references indicate similar elements and in which.

Other features of the present embodiments will be apparent from the accompanying drawings and from the detailed description that follows.

DETAILED DESCRIPTION

A high voltage input receiver with hysteresis using low voltage transistors is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
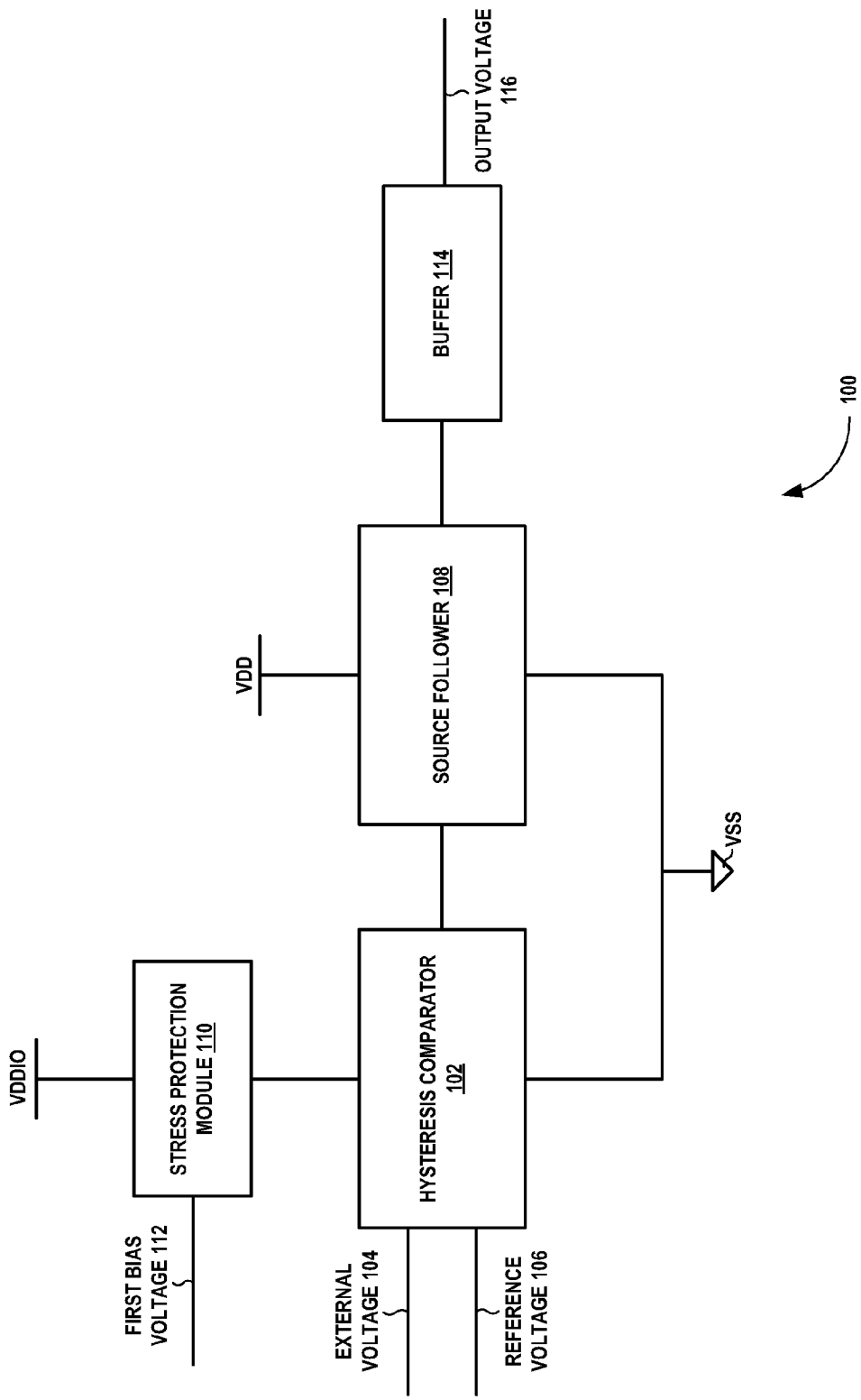
FIG. 1 is a block diagram of an exemplary input receiver system, according to one embodiment.

FIG. 1 is a block diagram of an exemplary input receiver system 100, according to one embodiment. As shown in FIG. 1, the input receiver system 100 includes a hysteresis comparator 102 coupled to an input/output supply voltage (VDDIO) for generating a first output voltage. In one embodiment, the hysteresis comparator 102 is formed using multiple low voltage transistors (e.g., thin oxide transistors). In one exemplary implementation, the hysteresis comparator 102 generates the first output voltage by comparing an external voltage 104 and a reference voltage 106. For example, the external voltage 104 is a pad voltage (e.g., 2.5 volts or 3.3 volts). In one embodiment, the reference voltage 106 is used to set switching point of the hysteresis comparator 102.

Further, in FIG. 1, the input receiver system 100 also includes a stress protection module 110 coupled to the hysteresis comparator 102 for preventing the low voltage transistors of the hysteresis comparator 102 from exceeding their reliability limits. For example, reliability limit refers to a maximum voltage level within which a low voltage transistor of the hysteresis comparator 102 is allowed to operate. In other words, if voltage across the low voltage transistor exceeds the reliability limit, then the low voltage transistor is considered as stressed, that is the voltage across the low voltage transistor terminals is more than the reliability limit. In one example embodiment, the stress protection module 110 is controlled by a first bias voltage 112 which is applied to the stress protection module 110. For example, a 1.8 V transistor can reliably operate up to a maximum voltage of 1.8+10%, i.e., 1.98 V.

Further as shown in FIG. 1, the input receiver system 100 includes a source follower 108 coupled to a core supply voltage (VDD) for transferring the first output voltage to an output node of the source follower 108. In one embodiment, the first output voltage is transferred to the output node of the source follower 108 from a voltage level of the VDDIO to a voltage level (i.e., core voltage level) of the VDD.

In addition, the input receiver system 100 includes a buffer 114 coupled to the output node of the source follower 108 to generate an output voltage 116 at the core voltage level which is the inverted output voltage of the source follower 108. In one exemplary implementation, the buffer 114 includes a complementary metal oxide semiconductor (CMOS) based inverter. Further, in one embodiment, the output voltage 116 of the buffer 114 changes from logical low to logical high when the external voltage 104 is greater than a positive trip point. In an alternate embodiment, the output voltage 116 of the buffer 114 changes from logical high to logical low when the external voltage 104 is less than a negative trip point. It is appreciated that, the positive trip point and the negative trip point are set based on the reference voltage supplied to the hysteresis comparator 102.

In one exemplary implementation, the hysteresis comparator 102 and the source follower 108 are coupled to a ground (VSS). It is appreciated that the input receiver system 100 can be implemented to a semiconductor device or chip to convert an external voltage (e.g., a pad voltage) of the semiconductor device to an output voltage. The block diagram for the input receiver system 100 is illustrated in FIG. 2.

Figure 2:
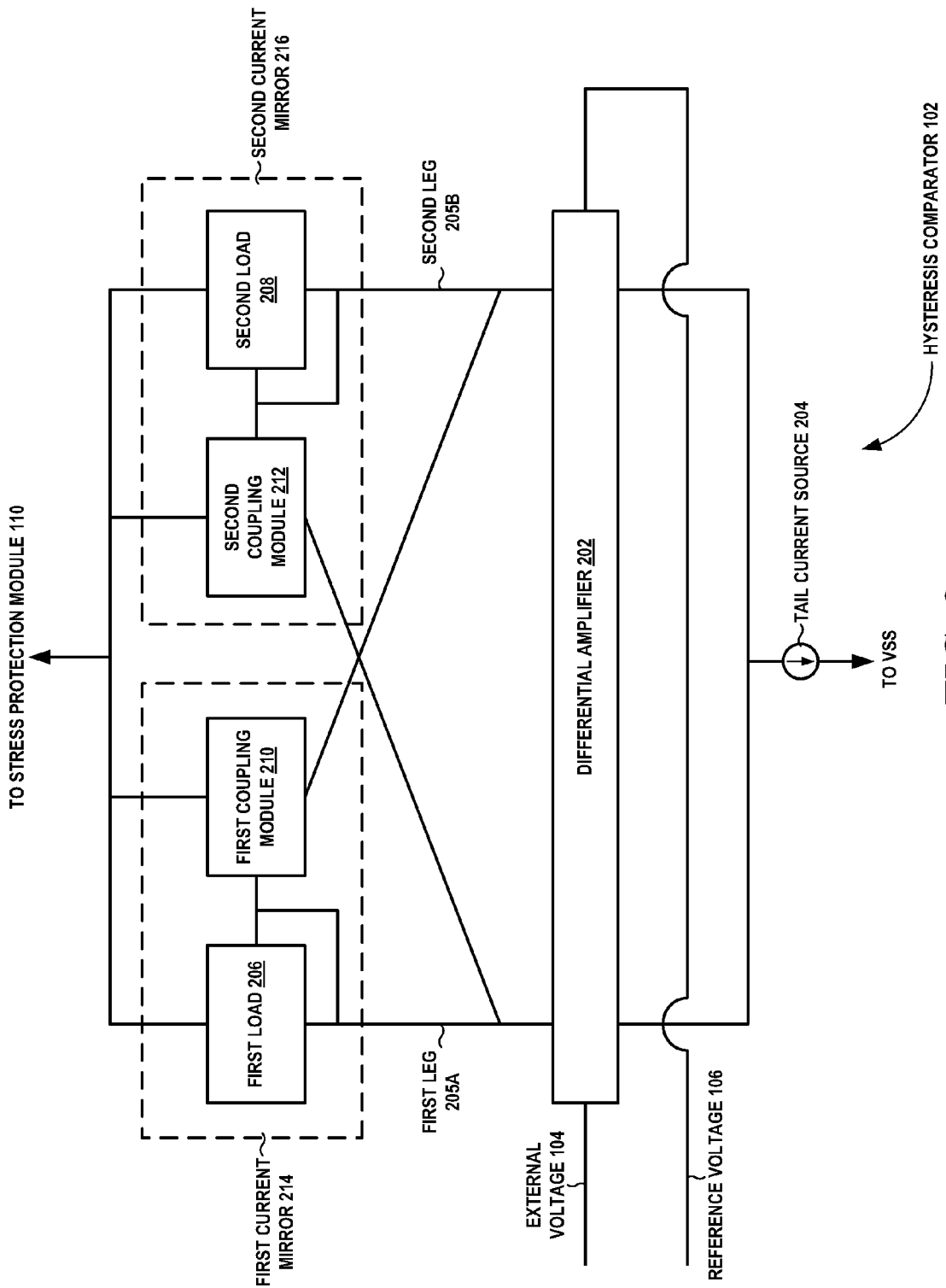
FIG. 2 is an exemplary module level diagram of the input receiver system of FIG. 1, according to one embodiment.

FIG. 2 is an exemplary module level diagram of the input receiver system 100 of FIG. 1, according to one embodiment. Particularly, FIG. 2 illustrates various blocks associated with the hysteresis comparator 102. As shown in FIG. 2, the hysteresis comparator 102 includes a differential amplifier 202 with the external voltage 104 coupled to a first leg 205A of the differential amplifier 202 and the reference voltage 106 coupled to a second leg 205B of the differential amplifier 202. Further, the hysteresis comparator 102 includes a tail current source 204 coupled to the differential amplifier 202. As shown in FIG. 2, the hysteresis comparator 102 also includes a first load 206 coupled to the first leg of the differential amplifier 202 and a second load 208 coupled to the second leg of the differential amplifier 202.

In addition, the hysteresis comparator 102 includes a first coupling module 210 and a second coupling module 212, as illustrated in FIG. 2. In one example embodiment, the first coupling module 210 coupled to the second leg forms a first current mirror 214 with the first load 206. In another example embodiment, the second coupling module 212 coupled to the first leg forms a second current mirror 216 with the second load 208. It is appreciated that the first coupling module 210 is associated with a positive threshold voltage and the second coupling module 212 is associated with a negative threshold voltage.

In one exemplary implementation, the tail current source 204 is coupled to a ground (VSS) and the first load 206, the second load 208, the first coupling module 210 and the second coupling module 212 are coupled to the stress protection module 110. The circuit diagram for the input receiver system 100 of FIG. 1 is illustrated in FIG. 3.

Figure 3:
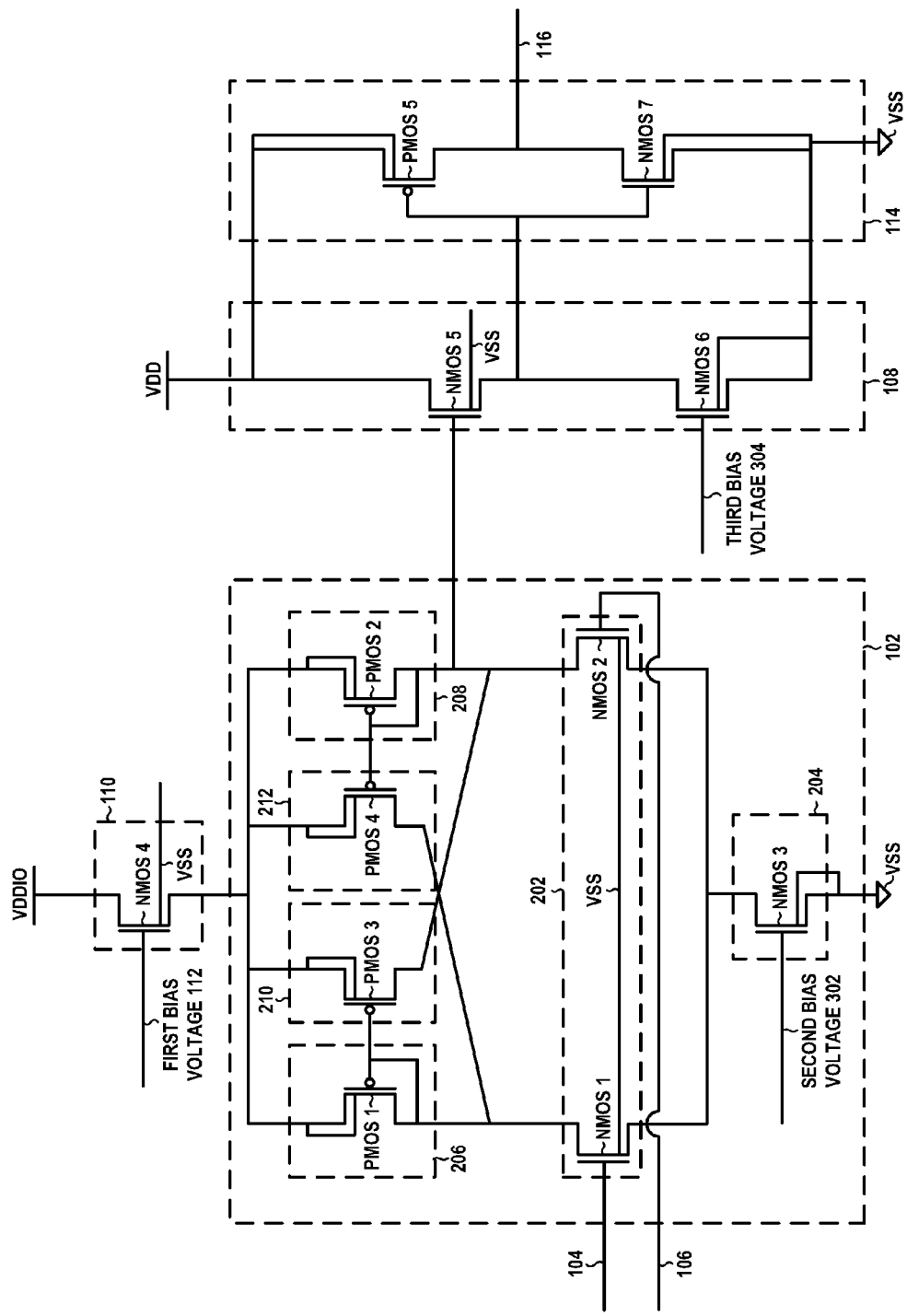
FIG. 3 is an exemplary circuit diagram of the input receiver system of FIG. 1, according to one embodiment.

FIG. 3 is an exemplary circuit diagram 300 of the input receiver system 100 of FIG. 1, according to one embodiment. Particularly, the circuit diagram 300 includes a hysteresis comparator circuit, a source follower circuit, a stress protection circuit and a buffer circuit. It is appreciated that each of the hysteresis comparator circuit, the source follower circuit, the stress protection circuit and the buffer circuit is an exemplary embodiment of the hysteresis comparator 102, the source follower 108, the stress protection module 110, and the buffer 114 of FIG. 1, respectively. As shown in FIG. 3, the hysteresis comparator circuit 102 includes the differential amplifier 202, the tail current source 204, the first load 206, the second load 208, the first coupling module 210 and the second coupling module 212.

Further, as shown in FIG. 3, the differential amplifier 202 includes a first n-channel metal oxide semiconductor (NMOS) transistor (NMOS 1) and a second NMOS transistor (NMOS 2), and the tail current source 204 includes a third NMOS transistor (NMOS 3). It is appreciated that the transistors NMOS 1 and NMOS 2 are equal in size (e.g., channel length and width). In one exemplary implementation, the external voltage 104 is coupled to the transistor NMOS 1 and the reference voltage 106 is coupled to the transistor NMOS 2. In another exemplary implementation, the transistor NMOS 3 is biased with a second bias voltage 302.

Also, in FIG. 3, the first load 206 includes a first p-channel metal oxide semiconductor (PMOS) transistor (PMOS 1), the second load 208 includes a second PMOS transistor (PMOS 2), the first coupling module 210 includes a third PMOS transistor (PMOS 3) and the second coupling module 212 includes a fourth PMOS transistor (PMOS 4). It is appreciated that the transistors PMOS 1 and PMOS 2 are equal in size (e.g., channel length and width). Further, size of transistors PMOS 3 and PMOS 4 is associated with the positive threshold voltage and the negative threshold voltage, respectively. It is appreciated that required hysteresis can be achieved by correctly sizing the transistors PMOS 3 and PMOS 4.

Further as shown in FIG. 3, the stress protection module 110 includes a fourth NMOS transistor (NMOS 4). In one exemplary implementation, the transistor NMOS 4 is biased with the first bias voltage 112. In another exemplary implementation, the transistor NMOS 4 is coupled to the VDDIO. Also as shown in FIG. 3, the source follower circuit 108 includes a fifth NMOS transistor (NMOS 5) and a sixth NMOS transistor (NMOS 6) coupled in series. In one exemplary implementation, the transistor NMOS 5 is coupled to the VDD and the transistor NMOS 6 is biased with a third bias voltage 304. Further, in FIG. 3, the buffer 114 includes a fifth PMOS transistor (PMOS 5) and a seventh NMOS transistor (NMOS 7) coupled in series. In one example embodiment, the transistors PMOS 5 and NMOS 7 form a CMOS inverter.

In accordance with the above described embodiments with respect to FIG. 3, the functioning of the circuit diagram 300 (e.g., the input receiver circuit) is as follows. In operation, the hysteresis comparator circuit 102 (based on a plurality of low voltage transistors (e.g., NMOS 1 through 3 and PMOS 1 through 4)) generates a first output voltage by comparing the external voltage 104 and the reference voltage 106. In one exemplary implementation, the hysteresis comparator circuit 102 is coupled to a VDDIO and the first output voltage is at a voltage level of the VDDIO. In one exemplary implementation, the stress protection module 110 coupled to the hysteresis comparator circuit 102 acts as a voltage divider and prevents the plurality of low voltage transistors of the hysteresis comparator circuit 102 from exceeding their reliability limits.

If the first output voltage generated by the hysteresis comparator circuit 102 is logical high and the external voltage 104 surpasses the reference voltage 106 (low state-to-high state transitioning), more current flows through the transistor NMOS 2 than the transistor NMOS 1. This results in the first output voltage to be lower than voltage at the drain node of the transistor NMOS 1.

Figure 4:
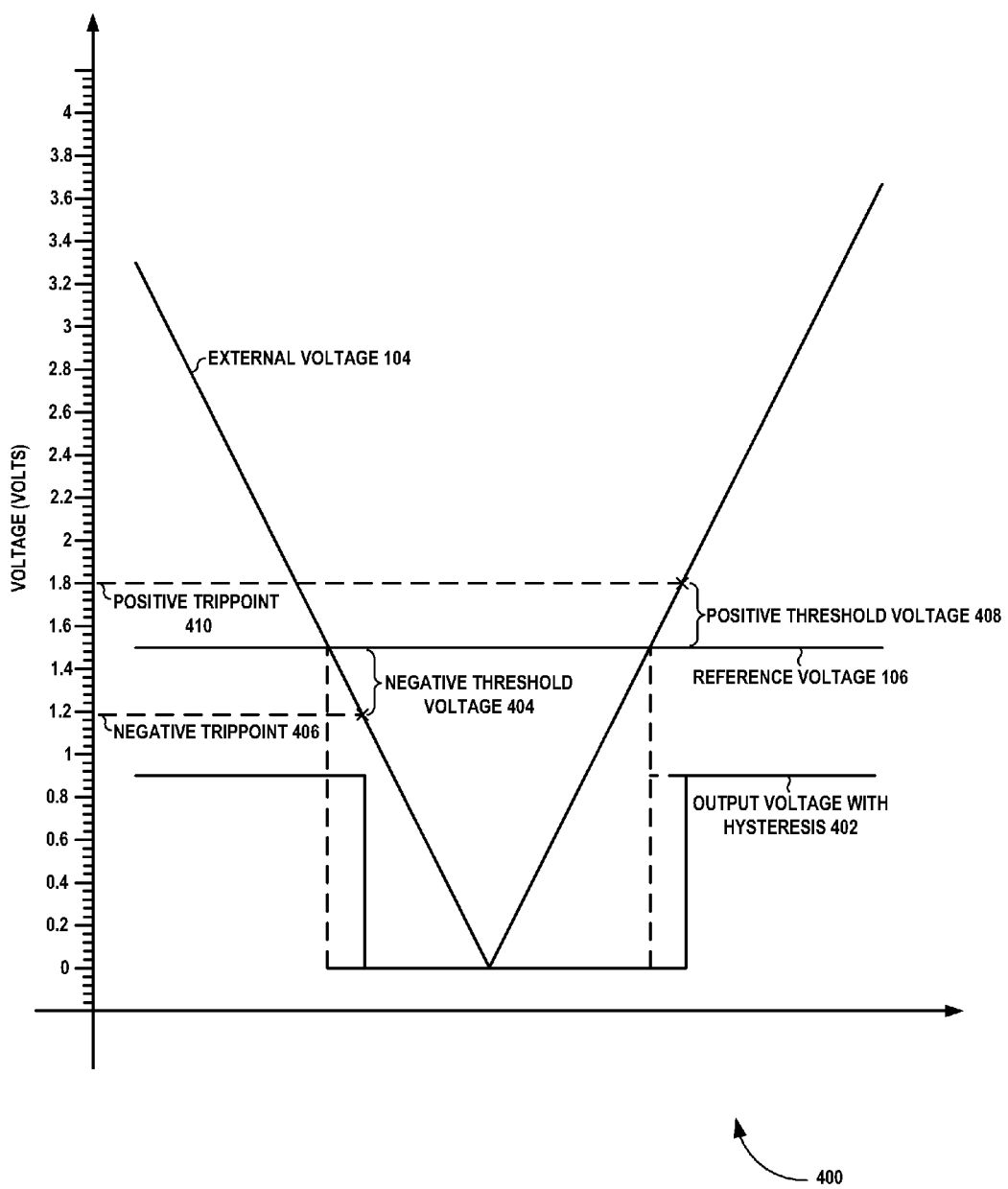
FIG. 4 is a graphical view of an exemplary DC response of the input receiver system in FIG. 1, according to one embodiment.

Further, the higher voltage at the drain node of the transistor NMOS 1 causes less current to flow through the transistor PMOS 4 and also through the transistor PMOS 2. On the contrary, the lower first output voltage causes more current to flow through the transistor PMOS 3 and also through the transistor PMOS 1. Furthermore, as the external voltage 104 continues to increase and reaches a point (e.g., positive threshold voltage), upon which the transistors PMOS 2 and PMOS 4 are turned off. At this point, the current through the transistor NMOS 2 becomes equal to the transistor PMOS 3. The point at which the current through the transistors NMOS 2 becomes equal to the transistors PMOS 3 is referred to as a positive trip point (as shown in FIG. 4). As a result, the first output voltage changes from logical high to logical low.

Alternatively, if the first output voltage generated by the hysteresis comparator circuit 102 is logical low and the external voltage 104 falls below the reference voltage 106 (high state-to-low state transitioning), more current flows through the transistor NMOS 1 than the transistor NMOS 2. This results in the first output voltage to be higher than voltage at the drain node of the transistor NMOS 1.

Further, the higher voltage at the drain node of the transistor NMOS 2 (i.e., the higher first output voltage) causes less current to flow through the transistor PMOS 3 and also through the transistor PMOS 1. On the contrary, the lower voltage at the drain node of the transistor NMOS 1 causes more current to flow through the transistor PMOS 4 and also through the transistor PMOS 2. Furthermore, as the external voltage 104 continues to decrease and reaches a point (e.g., negative threshold voltage), upon which the transistors PMOS 3 and PMOS 1 are turned off. At this point, the current through the transistor NMOS 1 becomes equal to the transistor PMOS 4. The point when the current through the transistor NMOS 1 becomes equal to the transistor PMOS 4 is referred to as a negative trip point (as shown in FIG. 4). As a result, the first output voltage changes from logical low to logical high.

Further, the source follower circuit 108 coupled to a VDD transfers the first output voltage to an output node of the source follower circuit 108 from a voltage level of the VDDIO to a voltage level of the VDD. The buffer circuit 114 then generates the output voltage 116 which is the inverted output voltage of the source follower circuit 108.

FIG. 4 is a graphical view of an exemplary DC response 400 of the input receiver system 100 of FIG. 1, according to one embodiment. Particularly, FIG. 4 illustrates DC characteristics obtained through simulation results of the input receiver system 100 in FIG. 1. FIG. 4 illustrates the external voltage 104 and the reference voltage 106. FIG. 4 also illustrates an output voltage with hysteresis 402 generated by the input receiver system 100. It is appreciated that the output voltage with hysteresis 402 is an exemplary embodiment of the output voltage 116 of FIG. 1.

Further, it is apparent from FIG. 4 that the output voltage with hysteresis 402 changes from logical high to logical low when the external voltage 104 is less than a negative trip point 406. As shown in FIG. 4, the negative trip point 406 is equivalent to the reference voltage 106 decreased by a negative (high state-to-low state transitioning) threshold voltage 404. Also, it is apparent from FIG. 4 that the output voltage with hysteresis 402 changes from logical low to logical high when the external voltage 104 is greater than a positive trip point 410. As shown in FIG. 4, the positive trip point 410 is equivalent to the reference voltage 106 increased by a positive (low state-to-high state transitioning) threshold voltage 408. Further, difference in two trip point voltages is referred to as hysteresis.

The above-described high voltage input receiver provides a stress free architecture such that it complies with joint electron device engineering council (JEDEC) specifications (even if low voltage transistors are used within higher supply voltages). Further, the above-described high voltage input receiver provides hysteresis in the input receiver while meeting the JEDEC specifications. The above-described high voltage input receiver can work generically on any high voltage supply by setting the reference voltage.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuitry (ASIC)).

What is claimed is:

1. An integrated circuit having a core and an input receiver for downconverting an external voltage (e.g., 104) having a voltage level of an input/output (I/O) supply VDDIO in a high-voltage VDDIO voltage domain into a downconverted voltage (e.g., 116) having a voltage level of a core supply VDD in a low-voltage VDD voltage domain, wherein the VDDIO voltage level of the external voltage is greater than the VDD voltage level of the downconverted voltage, wherein the input receiver comprises:

a hysteresis comparator (e.g., 102) configured to receive and compare the external voltage to a reference voltage (e.g., 106) and generate, with hysteresis, an intermediate voltage based on the comparison of the external voltage to the reference voltage;

voltage-conversion circuitry (e.g., 108/114) configured to convert the intermediate voltage from the high-voltage VDDIO voltage domain into the low-voltage VDD voltage domain of the downconverted voltage; and a stress protection module (e.g., 110) configured between the I/O supply VDDIO and a supply node of the hysteresis comparator, wherein:

the hysteresis comparator comprises a plurality of low voltage transistors that cannot operate reliably at the VDDIO voltage level; and the stress protection module enables the hysteresis comparator to operate properly in the high-voltage VDDIO voltage domain.

2. The integrated circuit of claim 1, wherein:

the hysteresis comparator comprises the plurality of low voltage transistors configured as:

a first load;

a second load;

a first coupling module associated with a positive threshold voltage; and a second coupling module associated with a negative threshold voltage;

the voltage-conversion circuitry comprises a source follower coupled to the core supply VDD for transferring the intermediate voltage to an output node of the source follower from a voltage level of the high-voltage VDDIO voltage domain to a voltage level of the low-voltage VDD voltage domain; and the stress protection module coupled between the I/O supply VDDIO and the supply node of the hysteresis comparator is configured to prevent the plurality of low voltage transistors of the hysteresis comparator from exceeding their reliability limits, wherein the stress protection module consists of a first NMOS transistor biased by a bias voltage applied only to a gate terminal of the first NMOS transistor, wherein the first load, the second load, the first coupling module, and the second coupling module are coupled to the stress protection module, and wherein the reference voltage is used to set a positive trip point and a negative trip point.

3. The integrated circuit of claim 2, wherein the voltage-conversion circuitry further comprises a buffer coupled to the output node of the source follower for generating the downconverted voltage, wherein the buffer comprises a CMOS based inverter.

4. The integrated circuit of claim 3, wherein the hysteresis comparator comprises:

a differential amplifier with the external voltage coupled to a first leg of the differential amplifier and the reference voltage coupled to a second leg of the differential amplifier;

a tail current source coupled to the differential amplifier;

the first load coupled to the first leg of the differential amplifier;

the second load coupled to the second leg of the differential amplifier;

the first coupling module coupled to the second leg for forming a first current mirror with the first load; and the second coupling module coupled to the first leg for forming a second current mirror with the second load, wherein the tail current source is coupled to a ground, wherein transistor sizes of the first coupling module and the second coupling module are respectively associated with the positive threshold voltage and the negative threshold voltage.

5. The integrated circuit of claim 4, wherein the differential amplifier comprises a second NMOS transistor and a third NMOS transistor.

6. The integrated circuit of claim 5, wherein the first load comprises a first PMOS transistor, and the second load comprises a second PMOS transistor.

7. The integrated circuit of claim 6, wherein the second NMOS transistor and the third NMOS transistor are equal in size, and wherein the first PMOS transistor and the second PMOS transistor are equal in size.

8. The integrated circuit of claim 7, wherein the first coupling module comprises a third PMOS transistor, and the second coupling module comprises a fourth PMOS transistor.

9. The integrated circuit of claim 8, wherein the tail current source comprises a fourth NMOS transistor.

10. The integrated circuit of claim 9, wherein the source follower comprises a fifth NMOS transistor and a sixth NMOS transistor coupled in series.

11. The integrated circuit of claim 10, wherein the buffer comprises a fifth PMOS transistor and a seventh NMOS transistor coupled in series.

12. The integrated circuit of claim 4, wherein the positive trip point is equivalent to the reference voltage increased by the positive threshold voltage.

13. The integrated circuit of claim 12, wherein the downconverted voltage changes from logical low to logical high when the external voltage is greater than the positive trip point.

14. The integrated circuit of claim 4, wherein the negative trip point is equivalent to the reference voltage decreased by the negative threshold voltage.

15. The integrated circuit of claim 14, wherein the downconverted voltage changes from logical high to logical low when the external voltage is less than the negative trip point.

16. The integrated circuit of claim 1, wherein the downconverted voltage of the input receiver changes from logical low to logical high when the external voltage is greater than the positive trip point, and wherein the downconverted voltage of the input receiver changes from logical high to logical low when the external voltage is less than the negative trip point.

17. A method for operating an integrated circuit having a core and an input receiver for downconverting an external voltage (e.g., 104) having a voltage level of an input/output (I/O) supply VDDIO in a high-voltage VDDIO voltage domain into a downconverted voltage (e.g., 116) having a voltage level of a core supply VDD in a low-voltage VDD voltage domain, wherein the VDDIO voltage level of the external voltage is greater than the VDD voltage level of the downconverted voltage, wherein the input receiver comprises:

a hysteresis comparator (e.g., 102) configured to receive and compare the external voltage to a reference voltage (e.g., 106) and generate, with hysteresis, an intermediate voltage based on the comparison of the external voltage to the reference voltage;

voltage-conversion circuitry (e.g., 108/114) configured to convert the intermediate voltage from the high-voltage VDDIO voltage domain into the low-voltage VDD voltage domain of the downconverted voltage; and a stress protection module (e.g., 110) configured between the I/O supply VDDIO and a supply node of the hysteresis comparator, wherein:

the hysteresis comparator comprises a plurality of low voltage transistors that cannot operate reliably at the VDDIO voltage level; and the stress protection module enables the hysteresis comparator to operate properly in the high-voltage VDDIO voltage domain, wherein the method comprises:

(a) applying the reference voltage to the input receiver; and
(b) applying the external voltage to the input receiver.

18. A method for downconverting an external voltage (e.g., 104) having a voltage level of an input/output (I/O) supply VDDIO in a high-voltage VDDIO voltage domain into a downconverted voltage (e.g., 116) having a voltage level of a core supply VDD in a low-voltage VDD voltage domain, wherein the VDDIO voltage level of the external voltage is greater than the VDD voltage level of the downconverted voltage, the method comprising:

(a) a hysteresis comparator (e.g., 102) receiving and comparing the external voltage to a reference voltage (e.g., 106) and generating, with hysteresis, an intermediate voltage based on the comparison of the external voltage to the reference voltage; and (b) voltage-conversion circuitry (e.g., 108/114) converting the intermediate voltage from the high-voltage VDDIO voltage domain into the low-voltage VDD voltage domain of the downconverted voltage, wherein:

a stress protection module (e.g., 110) is configured between the I/O supply VDDIO and a supply node of the hysteresis comparator;

the hysteresis comparator comprises a plurality of low voltage transistors that cannot operate reliably at the VDDIO voltage level; and the stress protection module enables the hysteresis comparator to operate properly in the high-voltage VDDIO voltage domain.

* * * * *